United States Patent
Wang (10) Patent No.: US 12,279,510 B2
(45) Date of Patent: Apr. 15, 2025

(54) SUPPORTING COMPONENT AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wenqiang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/756,587

(22) PCT Filed: May 13, 2022

(86) PCT No.: PCT/CN2022/092623
§ 371 (c)(1),
(2) Date: May 27, 2022

(87) PCT Pub. No.: WO2023/197395
PCT Pub. Date: Oct. 19, 2023

(65) Prior Publication Data
US 2024/0172542 A1    May 23, 2024

(30) Foreign Application Priority Data
Apr. 14, 2022 (CN) .......................... 202210391969.0

(51) Int. Cl.
*H10K 59/80* (2023.01)
*H10H 20/858* (2025.01)
*H10K 102/00* (2023.01)

(52) U.S. Cl.
CPC ..... *H10K 59/8794* (2023.02); *H10H 20/8582* (2025.01); *H10K 2102/311* (2023.02)

(58) Field of Classification Search
CPC .... H10K 59/8794; H10K 59/65; H10K 59/80; H10K 2102/311; H10K 77/10;
(Continued)

(56) References Cited

U.S. PATENT DOCUMENTS

2018/0121703 A1* 5/2018 Jung ....................... G06F 3/041

FOREIGN PATENT DOCUMENTS

| CN | 110767096 A | 2/2020 |
| CN | 113362712 A | 9/2021 |

(Continued)

OTHER PUBLICATIONS

International Search Report in International application No. PCT/CN2022/092623, mailed on Dec. 21, 2022.
(Continued)

*Primary Examiner* — Amar Movva
*Assistant Examiner* — Sandra Milena Rodriguez Villan (57) ABSTRACT

A supporting component and a display device are provided. The supporting component is configured to support the display panel. The supporting component includes a hole. The supporting component includes a first support portion and a second support portion. The first support portion is arranged around the hole. The second support portion is arranged around the first support portion. An elasticity modulus of the second support portion is greater than an elasticity modulus of the first support portion.

18 Claims, 6 Drawing Sheets

(58) Field of Classification Search
CPC ...... H10K 50/00; H10K 50/10; H01L 33/642; G06V 40/1318; G06V 40/12; H10H 20/8582; H10H 20/80
See application file for complete search history.

(56) References Cited

FOREIGN PATENT DOCUMENTS

| | | | |
|---|---|---|---|
| CN | 113724631 | A | 11/2021 |
| CN | 113793554 | A | 12/2021 |
| CN | 114170912 | A | 3/2022 |
| JP | 2021026102 | A | 2/2021 |

OTHER PUBLICATIONS

Written Opinion of the International Search Authority in International application No. PCT/CN2022/092623, mailed on Dec. 21, 2022.

\* cited by examiner

SUPPORTING COMPONENT AND DISPLAY DEVICE

FIELD OF DISCLOSURE

The present disclosure relates to the field of display technologies, in particular to a supporting component and a display device.

BACKGROUND

An under-screen fingerprint identification technology is a major breakthrough in a flexible organic light-emitting diode (OLED) display technology in recent years. This technology improves a sensitivity of touch operations. A fingerprint identification sensor element is generally disposed on a bottom of a screen, and an upper end is covered by a film layer and an adhesive layer in a module stack. In order to make fingerprint identification more sensitive, a circular or other shaped light-transmitting hole, that is, a fingerprint sensor hole, is usually provided on the film layer on the bottom side of a display device layer. In an actual production process, due to a poor production process, there may be flash, burr, fracture surface, and other defects around the sensor hole on material of a module supporting component. Furthermore, due to an existence of the fingerprint sensor hole, continuity and flatness of an entire surface of the material of the original module supporting component are destroyed. When the film layer is bonded, the sensor hole will press against the adjacent adhesive layer or film layer due to a top pressure of a fixture. Thus, an imprint is formed around the sensor hole, and the imprint can easily transfer residual stress to a surface of the display device layer. As a result, poor display, such as afterimages, dark lines, black spots, and uneven colors, has a great impact on an improvement of product yield. Therefore, effectively solving the imprint around the sensor hole is a process problem that needs to be solved urgently at present.

Accordingly, it is necessary to provide a new technical solution to solve the above-mentioned technical problems.

SUMMARY OF DISCLOSURE

Embodiments of the present disclosure provide a display panel for improving a problem of breakage of conductive structures caused when a bending region of a display panel is bent.

Embodiments of the present disclosure provide a supporting component and a display device for improving a technical problem of an imprint due to stress concentration after the supporting component and the display panel are attached together.

An embodiment of the present disclosure provides a supporting component. The supporting component is configured to support a display panel, and includes a hole, a first support portion, and a second support portion. The first support portion is arranged around the hole, the second support portion is arranged around the first support portion, and an elasticity modulus of the second support portion is greater than an elasticity modulus of the first support portion.

Alternatively, in some embodiments of the present disclosure, the first support portion includes a plurality of support regions arranged around the hole, and in a direction from an outer edge of the first support portion to the hole, the elasticity modulus corresponding to the support regions gradually decreases.

Alternatively, in some embodiments of the present disclosure, the supporting component further includes at least one opening disposed in any one of the support regions. In a direction from the outer edge of the first support portion to the opening, a ratio of an area of the opening to that of the support region where it is located gradually increases such that in the direction from the outer edge of the first support portion to the hole, the elasticity modulus corresponding to the support regions gradually decreases.

Alternatively, in some embodiments of the present disclosure, in any one of the support regions, a number of the openings is at least two, and at least two of the openings are arranged at intervals around the hole.

Alternatively, in some embodiments of the present disclosure, the hole is a circular hole, and an extension direction of the opening is the same as an extension direction of a hole wall of the hole.

Alternatively, in some embodiments of the present disclosure, the opening includes a first end and a second end opposite to the first end, the first end and the second end are connected to form a line segment, a direction of the line segment is the same as the extension direction of the hole wall of the hole, and in the direction from the outer edge of the first support portion to the hole, the line segment of the opening gradually decreases.

In any one of the support regions, any two adjacent openings are separated by a first distance, and the first distance between any two adjacent openings is the same.

Central angles of line segments of any two of the openings in a circle that is concentric with the hole are the same.

Alternatively, in some embodiments of the present disclosure, in the direction from the outer edge of the first support portion to the hole, the first distance gradually decreases.

Alternatively, in some embodiments of the present disclosure, the openings in any two adjacent support regions are arranged staggered in the direction from the outer edge of the first support portion to the hole.

Alternatively, in some embodiments of the present disclosure, the supporting component further includes at least one closed recess arranged around the hole in any one of the support regions. In the direction from the outer edge of the first support portion to the hole, a distance between two adjacent closed recesses gradually decreases.

Alternatively, in some embodiments of the present disclosure, the supporting component further includes at least one closed recess arranged around the hole in any one of the support regions. In the direction from the outer edge of the first support portion to the hole, a depth of the closed recess gradually increases.

Alternatively, in some embodiments of the present disclosure, a distance between any two adjacent closed recesses is the same, and the distance between two adjacent closed recesses ranges from 0.15 mm to 0.55 mm.

Correspondingly, an embodiment of the present disclosure further provides a display device, including a display panel and a supporting component. The display panel is disposed on the supporting component, and the supporting component is configured to support the display panel, and the supporting component includes a hole, a first support portion, and a second support portion. The first support portion is arranged around the hole, the second support portion is arranged around the first support portion, and an elasticity modulus of the second support portion is greater than an elasticity modulus of the first support portion.

Alternatively, in some embodiments of the present disclosure, the first support portion includes a plurality of support regions arranged around the hole, and in a direction from an outer edge of the first support portion to the hole, the elasticity modulus corresponding to the support regions gradually decreases.

Alternatively, in some embodiments of the present disclosure, any one of the support regions is provided with at least one opening, and in a direction from the outer edge of the first support portion to the opening, a ratio of an area of the opening to that of the support region where it is located gradually increases such that in the direction from the outer edge of the first support portion to the hole, the elasticity modulus corresponding to the support regions gradually decreases.

Alternatively, in some embodiments of the present disclosure, in any one of the support regions, a number of the openings is at least two, and at least two of the openings are arranged at intervals around the hole.

Alternatively, in some embodiments of the present disclosure, the hole is a circular hole, and an extension direction of the opening is the same as an extension direction of a hole wall of the hole.

Alternatively, in some embodiments of the present disclosure, the opening includes a first end and a second end opposite to the first end, the first end and the second end are connected to form a line segment, a direction of the line segment is the same as the extension direction of the hole wall of the hole, and in the direction from the outer edge of the first support portion to the hole, the line segment of the opening gradually decreases.

In any one of the support regions, any two adjacent openings are separated by a first distance, and the first distance between any two adjacent openings is the same.

Central angles of line segments of any two of the openings in a circle that is concentric with the hole are the same.

Alternatively, in some embodiments of the present disclosure, the display device further includes at least one closed recess arranged around the hole in any one of the support regions. In the direction from the outer edge of the first support portion to the hole, a depth of the closed recess gradually increases.

Alternatively, in some embodiments of the present disclosure, the display device further includes:
- a heat dissipation layer disposed on the supporting component, where the heat dissipation layer includes a through hole, the through hole is disposed on the hole, and a width of the through hole is smaller than a width of the hole; and
- a buffer layer disposed on a side of the heat dissipation layer away from the supporting component, where the through hole extends through the heat dissipation layer and the buffer layer.

Alternatively, in some embodiments of the present disclosure, a difference value between the hole and the through hole ranges from 1 mm to 4 mm.

The present disclosure provides the supporting component and the display device. The supporting component is configured to support the display panel. The supporting component includes the hole. The supporting component includes the first support portion and the second support portion. The first support portion is arranged around the hole. The second support portion is arranged around the first support portion. The elasticity modulus of the second support portion is greater than the elasticity modulus of the first support portion. In the embodiment of the present disclosure, by changing the elasticity modulus of the first support portion around the hole, the elasticity modulus of the first support portion is smaller than that of the second support portion, which makes it easier to attach the display panel on the supporting component, which improves a technical problem of an imprint caused by stress concentration after the supporting component and the display panel are bonded together.

BRIEF DESCRIPTION OF DRAWINGS

In order to illustrate technical solutions in the embodiments of the present disclosure more clearly, the following briefly introduces accompanying drawings required for the description of the embodiments. Obviously, the drawings in the following description are only some examples of the present disclosure. For those skilled in the art, other drawings can also be obtained from these drawings without creative efforts.

DETAILED DESCRIPTION

In order to make purposes, technical solutions, and advantages of the present disclosure more clear, the present disclosure will be further described in detail below with reference to the accompanying drawings. Referring to the drawings in the accompanying drawings, the same reference numerals represent the same components. The following description is based on the specific embodiments of the present disclosure shown and should not be construed as limiting other specific embodiments of the present disclosure not detailed herein. As used in this specification, the term "embodiment" means an instance, instance, or illustration.

In the description of the present disclosure, it should be understood that directions or location relationships indicated by terms "center", "longitudinal", "landscape", "length", "width", "thickness", "upper", "lower", "front", "rear", "left", "right", "vertical", "horizontal", "top", "bottom", "inner", "outer", "clockwise", and "counterclockwise" are directions or location relationships shown based on the accompanying drawings, are merely used for the convenience of describing the present disclosure and simplifying the description, but are not used to indicate or imply that a device or an element must have a particular direction or must be constructed and operated in a particular direction, and therefore, cannot be understood as a limitation to the present disclosure. In addition, terms "first" and "second" are merely used to describe the objective, but cannot be understood as indicating or implying relative importance or implying a quantity of indicated technical features. Therefore, features limited by "first" and "second" may indicate explicitly or implicitly that one or more features are included. In the description of the present disclosure, unless otherwise specifically limited, "multiple" means at least two, for example, two or more.

Embodiments of the present disclosure provide a supporting component and a display device. Each of them will be described in detail below. It should be noted that the description order of the following embodiments is not intended to limit the preferred order of the embodiments.

Figure 1:
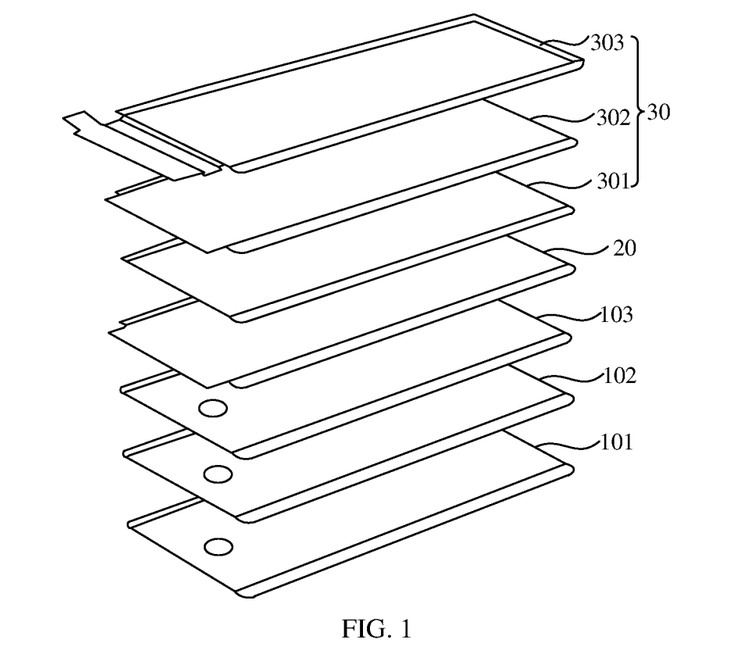
FIG. 1 is a schematic structural diagram of a display device of an embodiment of the present disclosure.
Figure 2:
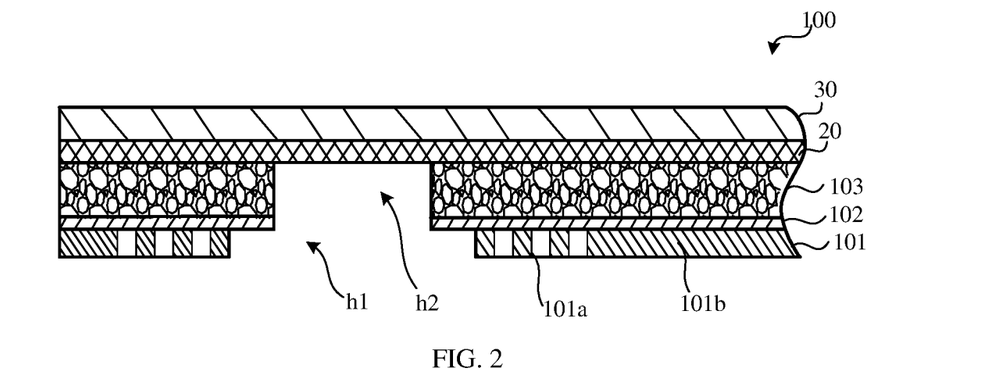
FIG. 2 is a schematic cross-sectional view of a display device of an embodiment of the present disclosure.

Referring to FIG. 1 and FIG. 2, FIG. 1 is a schematic structural diagram of a display device of an embodiment of the present disclosure, and FIG. 2 is a schematic cross-sectional view of a display device of an embodiment of the present disclosure. An embodiment of the present disclosure provides a display device 100. The display device 100 includes a display panel 30 and a supporting component 101, and the display panel 30 is disposed on the supporting component 101.

In the embodiment of the present disclosure, the supporting component 101 includes a hole h1. The supporting component 101 includes a first support portion 101a and a second support portion 101b. The first support portion 101a is arranged around the hole h1. The second support portion 101b is arranged around the first support portion 101a. An elasticity modulus of the second support portion 101b is greater than an elasticity modulus of the first support portion 101a. In the embodiment of the present disclosure, due to an existence of the hole h1, material continuity and overall flatness of the original module supporting component are destroyed. When the display panel 30 is bonded, due to a top pressure of a fixture, the hole h1 will press an adjacent adhesive layer or film layer to form an imprint around it. The imprint can easily transfer residual stress to a surface of the display panel 30, resulting in display defects such as afterimages, dark lines, black spots, and uneven colors, which have a great impact on an improvement of a product yield. Therefore, in the embodiment of the present disclosure, by changing the elasticity modulus of the first support portion 101a around the hole h1, the elasticity modulus of the first support portion 101a is smaller than that of the second support portion 101b, and it is easier to attach the display panel 30 on the supporting component 101. The technical problem of imprint caused by stress concentration after the supporting component 101 and the display panel 30 are bonded has been improved. In addition, in the display device 100 of the embodiment of the present disclosure, it can prevent a problem of poor display of the display device 100 due to the stress of the hole h1 being transmitted to an inside of the display panel 30 during a lamination process.

In some embodiments, the display device 100 also includes a heat dissipation layer 102 and a buffer layer 103. The heat dissipation layer 102 is disposed on the supporting component 101. The heat dissipation layer 102 includes a through hole h2. The through hole h2 is disposed on the hole h1. The through hole h2 and the hole h1 form a connected structure. Also, a width of the through hole h2 is smaller than a width of the hole h1. A buffer layer 103 is disposed on a side of the heat dissipation layer 102 away from the supporting component 101. The through hole h2 extends through the heat dissipation layer 102 and the buffer layer 103. In the embodiment of the present disclosure, the heat dissipation layer 102 and the supporting component 101 adopt a non-aligned design, that is, the width of the hole h1 is larger than the width of the through hole h2. When the supporting component 101 is arranged on a side of the heat dissipation layer 102 away from the buffer layer 103, it can effectively disperse a top compressive stress generated during lamination, thereby reducing the transmission of lamination stress to the display panel 30, further solving and reducing the imprint problem.

In some embodiments, material of the heat dissipation layer 102 can be selected from carbon-based composite materials such as graphite-based composite materials and carbon nanotubes. Material of the buffer layer 103 is foam, but not limited thereto.

In some embodiments, a difference value between the hole h1 and the through hole h2 ranges from 1 mm to 4 mm Preferably, the difference value between the hole h1 and the through hole h2 ranges from 1.5 mm to 3 mm. For example, the difference value between the hole h1 and the through hole h2 can be any one of 1.0 mm, 1.2 mm, 1.5 mm, 1.8 mm, 2.1 mm, 2.7 mm, 3 mm, 3.5 mm, or 4 mm. In the embodiment of the present disclosure, the difference value between the hole h1 and the through hole h2 ranges from 1 mm to 4 mm, that is, the supporting component 101 and the heat dissipation layer 102 and the buffer layer 103 adopt a non-aligned design. When the supporting component 101 is arranged on the side of the heat dissipation layer 102 away from the buffer layer 103, it can effectively disperse the top compressive stress generated during lamination, thereby reducing the transmission of lamination stress to the display panel 30, and further solving and reducing the imprint problem.

In some embodiments, the display device 100 further includes an adhesive layer 20. The adhesive layer 20 is disposed between the supporting component 101 and the display panel 30. The adhesive layer 20 is configured to bond the supporting component 101 and the display panel 30.

In some embodiments, the display panel 30 includes a backplane 301, an optical adhesive layer 302, and a display layer 303 that are stacked in sequence.

It should be noted that, in the embodiments of the present disclosure, the display panel 30 of the embodiments of the present disclosure may be an organic light-emitting diode (OLED) display panel, a micro light-emitting diode (micro-LED) display panel, and a mini light-emitting diode (mini-LED) display panel, etc. A third display panel 30 is the mini-LED display panel or the micro-LED display panel, and the third display panel 30 may also be the OLED display panel.

It should be noted that, in the embodiments of the present disclosure, the display device 100 may further include a biometric identification module. The biometric module is disposed in the hole h1, and the biometric module is used for biometric identification.

The supporting component of the present disclosure will be described in detail below through specific embodiments.

Figure 3:
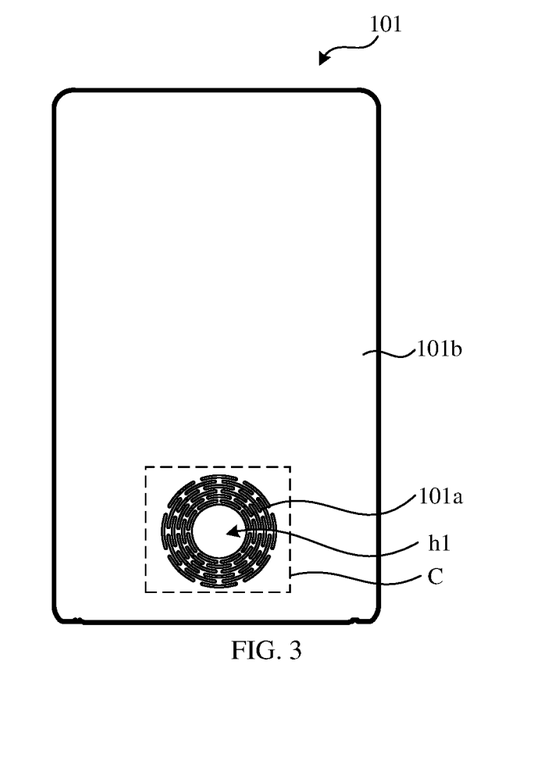
FIG. 3 is a first structural schematic diagram of a supporting component of an embodiment of the present disclosure.

Referring to FIG. 1 and FIG. 3, FIG. 3 is a first structural schematic diagram of a supporting component of an embodiment of the present disclosure. The embodiment of the present disclosure provides a supporting component 101. The supporting component 101 is configured to support the above-mentioned display panel 30. The supporting component 101 includes a hole h1. The supporting component 101 includes a first support portion 101a and a second support portion 101b. The first support portion 101a is arranged around the hole h1. The second support portion 101b is arranged around the first support portion 101a. An elasticity modulus of the second support portion 101b is greater than an elasticity modulus of the first support portion 101a. In the embodiment of the present disclosure, due to an existence of the hole h1, material continuity and overall flatness of the original module supporting component are destroyed. When the display panel 30 is bonded, due to a top pressure of a fixture, the hole h1 will press an adjacent adhesive layer or film layer to form an imprint around it. The imprint can easily transfer residual stress to a surface of the display panel 30, resulting in display defects such as afterimages, dark lines, black spots, and uneven colors, which have a great impact on an improvement of a product yield. Therefore, in the embodiment of the present disclosure, by changing the elasticity modulus of the first support portion 101a around the hole h1, the elasticity modulus of the first support portion 101a is smaller than that of the second support portion 101b, and it is easier to attach the display panel 30 on the supporting component 101. The technical problem of imprint caused by stress concentration after the supporting component 101 and the display panel 30 are bonded has been improved. In addition, in the display device 100 of the embodiment of the present disclosure, it can prevent a problem of poor display of the display device 100 due to the stress of the hole h1 being transmitted to an inside of the display panel 30 during a lamination process.

In some embodiments, material of the supporting component 101 may be selected from at least one of stainless steel, structural steel, titanium alloy, copper, copper alloy, aluminum alloy, and magnesium alloy, but is not limited thereto.

Figure 4:
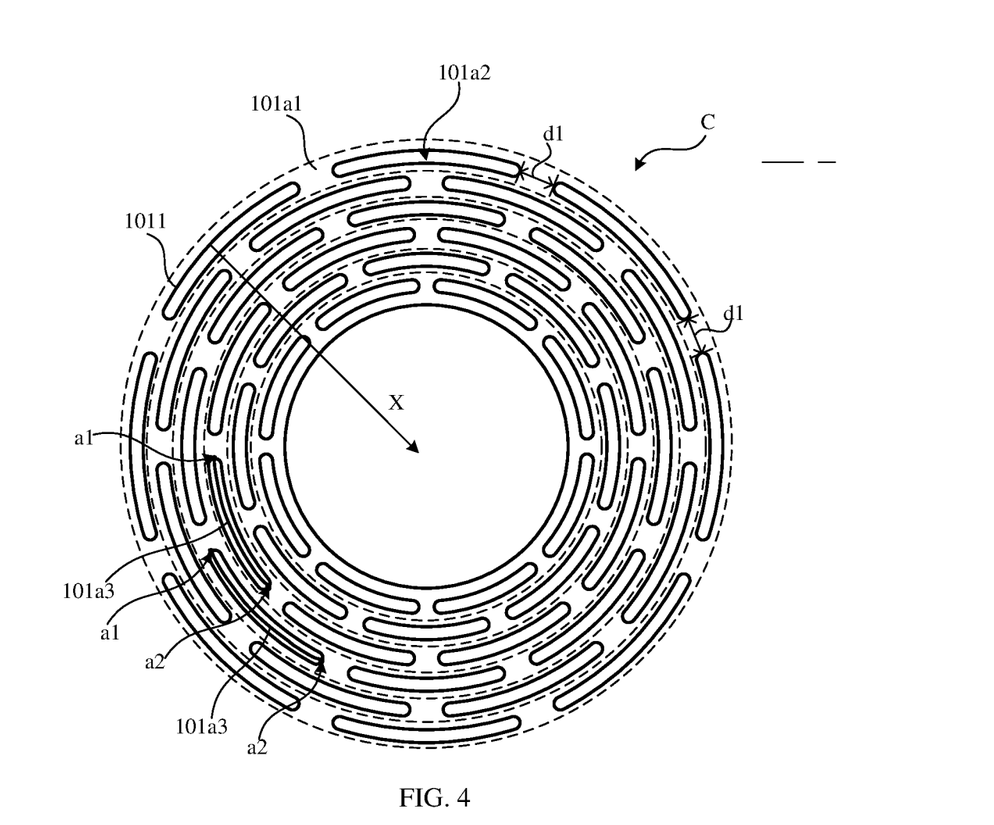
FIG. 4 is an enlarged view of a C region in FIG. 3.

Referring to FIG. 4, FIG. 4 is an enlarged view of a C region in FIG. 3. The first support portion 101a includes a plurality of support regions 101a1 arranged around the hole h1. In a direction X from an outer edge 1011 of the first support portion 101a to the hole h1, the elasticity modulus corresponding to the support regions 101a1 gradually decreases. In the embodiment of the present disclosure, in the direction X from the outer edge 1011 of the first support portion 101a to the hole h1, the elasticity modulus corresponding to the support regions 101a1 gradually decreases. That is, while reducing the modulus and stiffness of the first support portion 101a and ensuring the support flatness, material of the first support portion 101a can better match the modulus of the adjacent adhesive layer or film layer. In this way, the residual stress and top compressive stress transferred from the first support portion 101a to an inside of the display panel 30 during the 3D lamination process can be relieved in a gradient manner. When the first support portion 101a is subjected to an external compressive stress, the stress distribution is more uniform and relaxed, which can effectively prevent stress concentration caused by the sudden change of stress on a local sub-structure, reduce a risk during the lamination process, and thus improve the problem of poor display caused by imprint.

It should be noted that, for convenience of expression, the first support portion 101a is divided into a plurality of support regions 101a1. As shown in FIG. 4, the support region 101a1 refers to a region bounded by any adjacent two annular dotted lines.

Referring to FIG. 4, any one of the support regions 101a1 is provided with at least one opening 101a2. In the direction X from the outer edge 1011 of the first support portion 101a to the hole h1, a ratio of an area of the opening 101a2 to that of the support region 101a1 where it is located gradually increases. In the embodiment of the present disclosure, the elasticity modulus of the support regions 101a1 is adjusted by changing the ratio of the area of the opening 101a2 to the support regions 101a1 where it is located. In the direction X from the outer edge 1011 of the first support portion 101a to the hole h1, the elasticity modulus corresponding to the support regions gradually decreases.

In some embodiments, in any one of the support regions 101a1, a number of the openings 101a2 is at least two. At least two of the openings 101a2 are arranged at intervals around the hole h1. It should be understood that the openings 101a2 are arranged at intervals around the hole h1, and the openings 101a2 and the support regions 101a1 have a same extension direction.

In some embodiments, the openings in any two adjacent support regions 101a2 are arranged staggered in the direction from the outer edge of the first support portion to the hole. In the embodiment of the present disclosure, by designing the openings 101a2 in any two adjacent support regions 101a1 to be staggered, a structure of the first support portion 101a is uniformly stressed, which can coordinately buffer and uniformly disperse an external top compressive stress, and prevent local stress concentration. Thus, the display layer structure is protected during the display panel lamination process. Specifically, when the hole h1 is a circular hole, the openings 101a2 in two adjacent support regions 101a are staggered in a radial direction of the hole h1.

In some embodiments, the hole h1 is a circular hole, and an extension direction of the opening 101a2 is the same as an extension direction of a side wall of the hole h1. In the embodiment of the present disclosure, since the opening 101a2 and the side wall of the hole h1 have the same extension direction. In the lamination process of the display panel, the top compressive stress during lamination is consistent with the direction of the hole h1, which further improves the imprint problem.

A shape of the opening 101a2 is a long strip.

Figure 5:
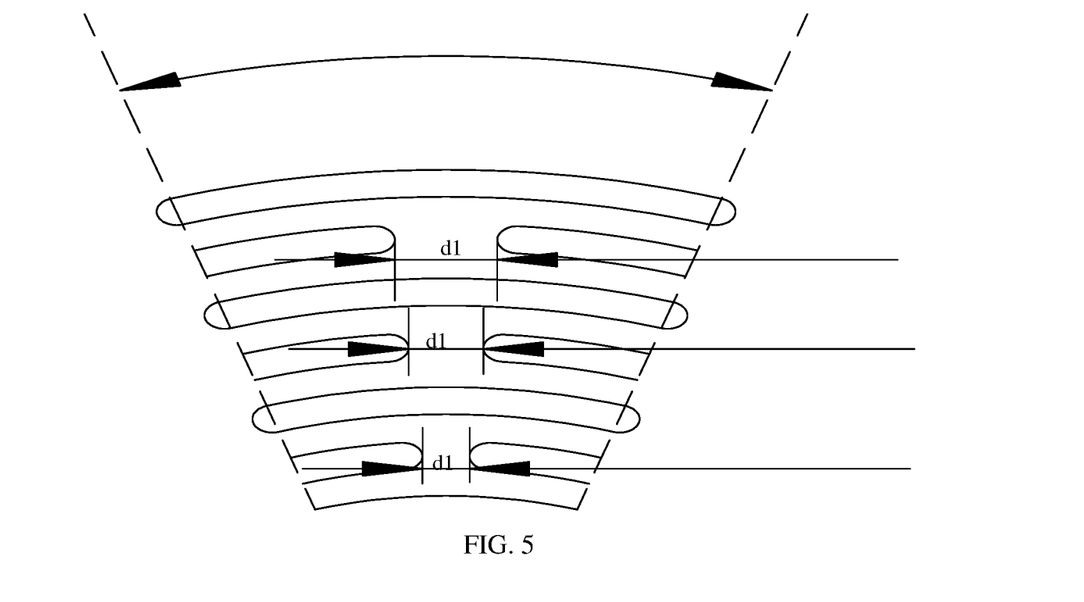
FIG. 5 is a partial enlarged view of FIG. 4.

Referring to FIG. 4 and FIG. 5, FIG. 5 is a partial enlarged view of FIG. 4. In some embodiments, the opening 101a2 includes a first end a1 and a second end a2 opposite the first end a1. The first end a1 and the second end a2 are connected to form a line segment 101a3. A direction of the line segment 101a3 is the same as the extension direction of the hole wall of the hole h1. The line segment 101a3 of the opening 101a2 gradually decreases in the direction from the outer edge 1011 of the first support portion 101a to the hole h1. In any one of the support regions 1011, any two adjacent openings 101a2 are separated by a first distance d1, and the first distance d1 between any two adjacent openings 101a2 is the same. Also, in a circle with a center of the hole h1 as the center, central angles of any two openings 101a2 are the same. In the embodiment of the present disclosure, an arrangement rule of the openings 101a2 in the plurality of support regions 1011 can be understood as that: in the direction X from the outer edge 1011 of the first support portion 101a to the hole h1, the openings 101a2 in the plurality of support regions 1011 have the same central angle in the circle with the center of the hole h1 as the center, so as to adjust and control a periodic and regular arrangement of the openings 101a2. Through the design in this way, the modulus of the first support portion 101a is decreased in a gradient manner, which prevents a stress gradient difference caused by the sudden change of the bending stiffness of the second support portion 101b and the first support portion 101a, resulting in residual stress during bonding. In addition, the structure of the first support portion 101a is uniformly stressed, which can coordinately buffer and evenly disperse the external top pressure stress, and prevent local stress concentration, thereby protecting the screen display device layer structure during the lamination process of the display panel 30.

It should be noted that, in the embodiments of the present disclosure, the central angle refers to an angle formed by connecting both ends of an arc length to the center of the circle.

In some embodiments, two ends of the openings 101a2 of the two separated support regions are at the same angle, so as to adjust and control the periodic and regular arrangement of the openings 101a2. It should be noted that, in the embodiments of the present disclosure, two separate support regions refer to two support regions separated by one support region 1011. It can be understood that the first support portion 101a is divided into M regions, and when M is a natural number greater than or equal to 3, the two separated support regions are a M-th support region and a (M+2)th support region.

Figure 6:
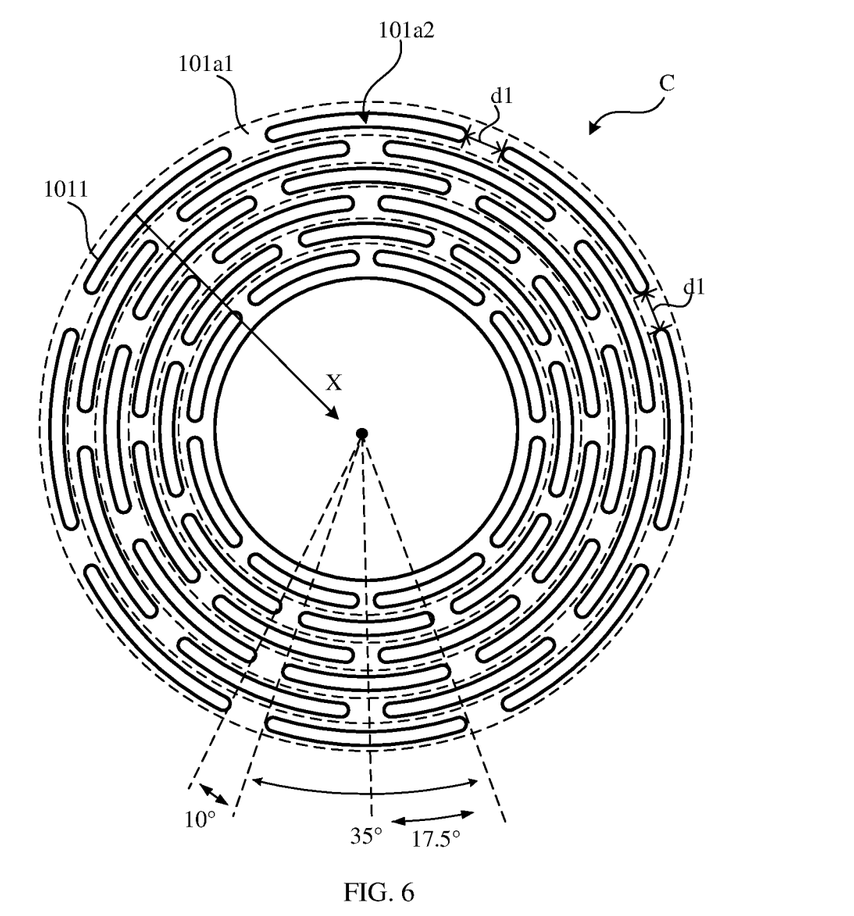
FIG. 6 is a schematic diagram of FIG. 4.

Referring to FIG. 6, the first distance d1 gradually decreases in the direction X from the outer edge 1011 of the first support portion 101a to the hole h1. Since the smaller the first distanced) is, the smaller the overall elastic modulus in the corresponding support regions is. Therefore, in the embodiment of the present disclosure, in the direction X from the outer edge 1011 of the first support portion 101a to the hole h1, the first distance d1 gradually decreases. The moduli of the first support portion 101a are adjusted in combination with the gradient design of the opening 101a2 to change in a uniform gradient, so that the first support portion 101a is subjected to a more uniform force and avoids stress concentration.

Referring to FIG. 6, FIG. 6 is a schematic diagram of FIG. 4. In a specific embodiment, in the direction X from the outer edge 1011 of the first support portion 101a to the hole h1, the two ends of the openings 101a2 in the plurality of support regions 1011 are scaled at intervals of 10°, and the two ends of the openings 101a2 of the two separated support regions are at 35°. Also, centers of the two openings 101a2 in two support regions correspond to each other (e.g., 17.5° in FIG. 7), so as to adjust and control the periodic and regular arrangement of the openings 101a2. Through the design in this way, the modulus of the first support portion 101a is reduced in a gradient manner, avoiding the stress gradient difference caused by the sudden change of the bending stiffness of the second support portion 101b and the first support portion 101a, and causing residual stress during bonding. In addition, the structure of the first support portion 101a is uniformly stressed, which can coordinately buffer and evenly disperse the external top pressure stress, and avoid local stress concentration, thereby protecting the screen display device layer structure during the lamination process of the display panel 30.

It should be noted that the angle of the opening 101a2 is adjusted according to an actual size of the hole h1 and the size of the fitting pressure. In the direction X from the outer edge 1011 of the first support portion 101a to the hole h1, when a diameter of the hole h1 ranges from 6 mm to 12 mm, the two ends of the openings 101a2 in the plurality of support regions 1011 can be designed to be 8° to 15°. For example, in the direction X pointing from the outer edge 1011 of the first support portion 101a to the hole h1, the two ends of the openings 101a2 in the plurality of support regions 1011 can be designed at any one of 8°, 10°, 11°, 13°, and 15°. The two ends of the openings 101a2 of the two separated support regions can be designed to be in the range of 25° to 40°. For example, the two ends of the openings 101a2 of the two separated support regions can be designed to be at any one of 25°, 28°, 30°, 35°, 37° or 40°. The specific optimal angle design and interval value can be determined in combination with mechanical simulation analysis.

It should be noted that the arc length of the opening 101a2 is not limited to a specific size, and can be determined according to a specific stack structure. When the diameter of the hole h1 is in the range of 6 mm to 12 mm, the length of the opening 101a2 can be adjusted in the range of 2 mm to 6.5 mm. In any two adjacent support regions 1011, an interval value of the two adjacent openings 101a2 can be designed in the range of 0.1 mm to 0.35 mm.

It should be noted that, in the embodiments of the present disclosure, a shape of the hole h1 includes but is not limited to a circle.

In some embodiments, the supporting component 101 further includes an adhesive layer (not shown). The adhesive layer is disposed in the opening 101a2. In an embodiment of the present disclosure, by providing the adhesive layer in the opening 101a2 of the supporting component 101, there is no step difference between the first support portion 101a and the second support portion 101b. Therefore, when the display panel 30 is disposed above the supporting component, air bubbles will not be generated due to the step difference, which prevents the display panel 30 above the supporting component 101 from falling off.

In some embodiments, an elasticity modulus of the adhesive layer is less than an average elasticity modulus of the first support portion 101a.

It should be noted that, in the embodiment of the present disclosure, the average elasticity modulus of the first support portion 101a may be obtained by measuring the elasticity moduli of a plurality of different support regions 101a1, and taking an average value of the elasticity moduli of the plurality of different support regions 101a1.

Figure 7:
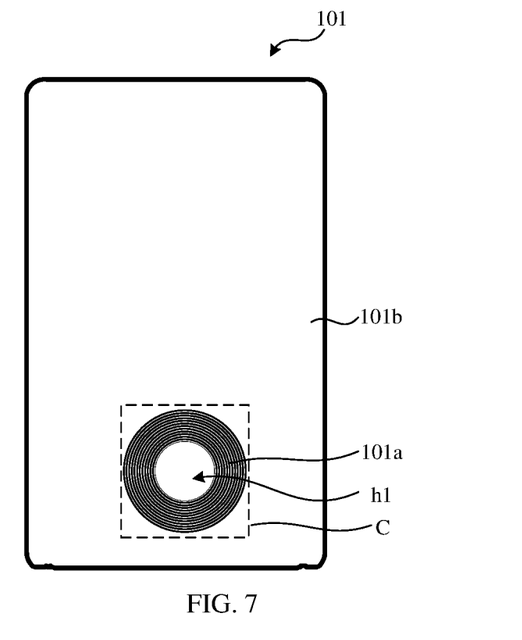
FIG. 7 is a second structural schematic diagram of a supporting component of an embodiment of the present disclosure.
Figure 8:
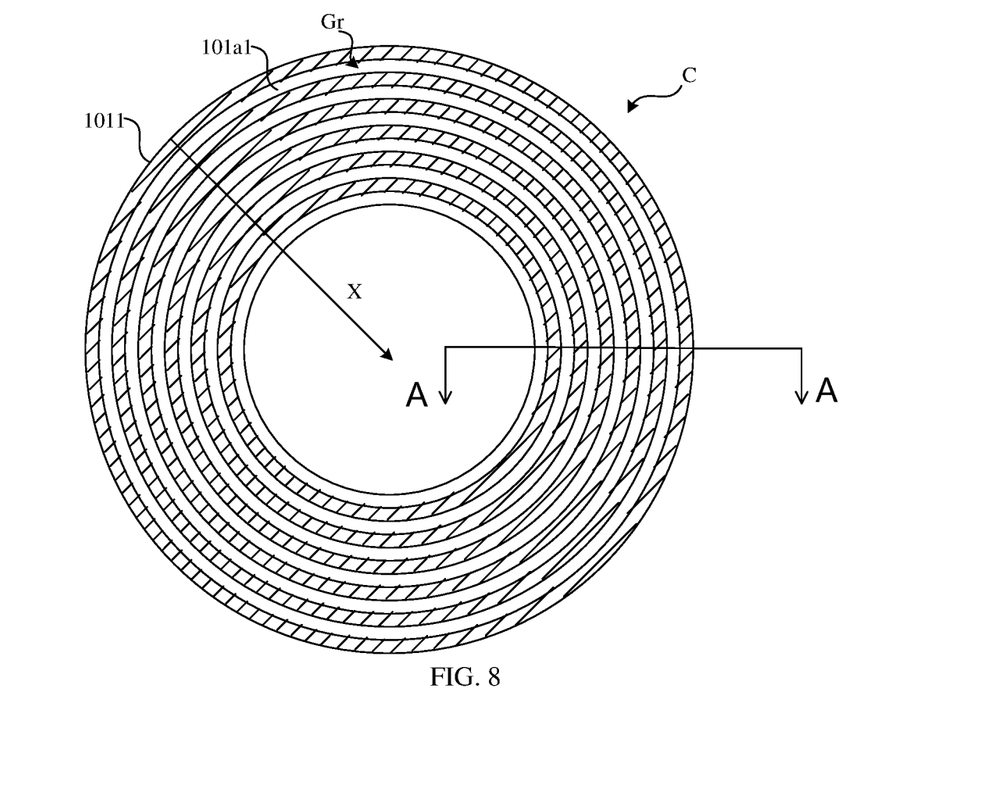
FIG. 8 is an enlarged view of a C region in FIG. 7.
Figure 9:
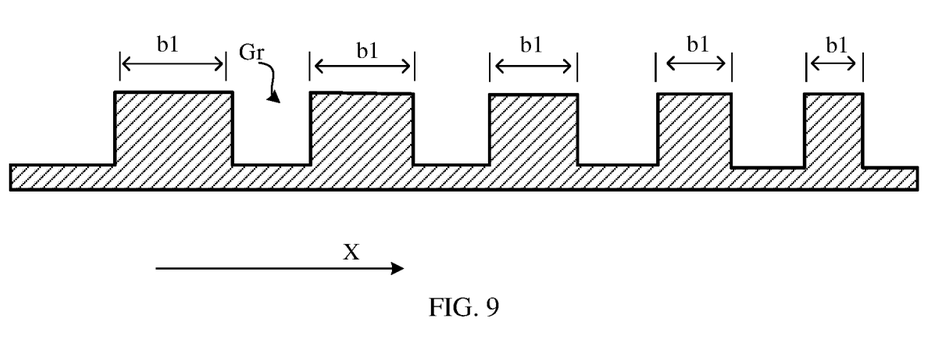
FIG. 9 is a first schematic diagram taken along an A-A direction of FIG. 8.

Referring to FIG. 7 to FIG. 9, FIG. 7 is a second structural schematic diagram of a supporting component of an embodiment of the present disclosure, FIG. 8 is an enlarged view of a C region in FIG. 7, and FIG. 9 is a first schematic diagram taken along an A-A direction of FIG. 8. A difference between the supporting component 101 of the embodiment of the present disclosure and the supporting component 101 in FIG. 3 is that any one of the supporting regions 1011 is provided with at least one closed recess Gr arranged around the hole h1. In the direction X from the outer edge 1011 of the first support portion 101a to the hole h1, a distance between two adjacent closed recesses Gr gradually decreases. In the embodiment of the present disclosure, in the direction X from the outer edge 1011 of the first support portion 101a to the hole h1, the distance b1 between two adjacent closed recesses Gr gradually decreases. The modulus of the first support portion 101a is changed in a uniform gradient manner, so that the first support portion 101a is subjected to a more uniform force, and the stress concentration is avoided.

In some embodiments, the hole h1 is a circular hole, and the closed recess Gr and the hole h1 have the same shape.

In some embodiments, the supporting component 101 further includes an adhesive layer (not shown). The adhesive layer is disposed in the opening 101a2. In an embodiment of the present disclosure, by providing the adhesive layer in the opening 101a2 of the supporting component 101, there is no step difference between the first support portion 101a and the second support portion 101b. Therefore, when the display panel 30 is disposed above the supporting component, air bubbles will not be generated due to the step difference, which prevents the display panel 30 above the supporting component 101 from falling off.

In some embodiments, the supporting component 101 further includes an adhesive layer (not shown). The adhesive layer is disposed in the closed recess Gr. In an embodiment of the present disclosure, by providing the adhesive layer in the closed recess Gr of the supporting component 101, there is no step difference between the first support portion 101a and the second support portion 101b. Therefore, when the display panel 30 is disposed above the supporting component, air bubbles will not be generated due to the step difference, which prevents the display panel 30 above the supporting component 101 from falling off.

In some embodiments, an elasticity modulus of the adhesive layer is less than an average elasticity modulus of the first support portion 101a.

It should be noted that, in the embodiment of the present disclosure, the average elasticity modulus of the first support portion 101a may be obtained by measuring the elasticity moduli of a plurality of different support regions 101a1, and taking an average value of the elasticity moduli of the plurality of different support regions 101a1.

Figure 10:
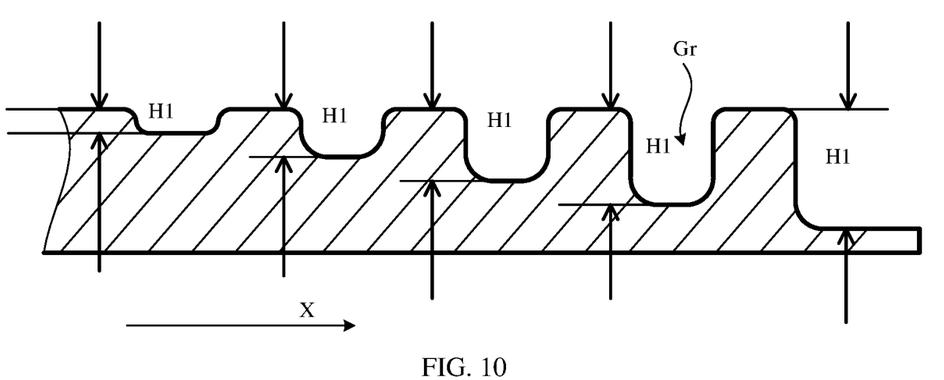
FIG. 10 is a second schematic diagram taken along an A-A direction of FIG. 8.

Referring to FIG. 7, FIG. 8, and FIG. 10, FIG. 10 is a second schematic diagram taken along an A-A direction of FIG. 8. A difference between the supporting component 101 of the embodiment of the present disclosure and the supporting component 101 in FIG. 9 is that any one of the supporting regions 1011 is provided with at least one closed recess Gr arranged around the hole h1. In the direction X from the outer edge 1011 of the first support portion 101a to the hole h1, a depth H1 of the closed recess Gr gradually increases. In the embodiment of the present disclosure, it can be understood that the first support portion 101a adopts a half-etching method, and the hole h1 is formed as an annular recess h1. An interval of the annular recesses h1 is the same, and the depth of the closed recess Gr changes gradient. That is, it can be understood that by designing different recess depths, the stress of the entire first support portion 101a can also realize the gradual change of the elasticity modulus or stiffness. That is, in the direction X from the outer edge 1011 of the first support portion 101a to the hole h1, the elasticity modulus corresponding to the support regions 101a1 gradually decreases, so that the first support portion 101a is subjected to a more uniform force, which is easier to attach and form, and reduces a risk of the imprint when bonding.

In some embodiments, the hole h1 is a circular hole, and the closed recess Gr and the hole h1 have the same shape.

In some embodiments, a distance between any two adjacent closed recess Gr is the same, and a value range of the distance between two adjacent closed recesses Gr is between 0.15 mm and 0.55 mm. For example, a value of the distance between two adjacent closed recesses Gr may be any one of 0.15 mm, 0.2 mm, 0.25 mm, 0.35 mm, 0.40 mm, 0.5 mm, and 0.55 mm. In the embodiment of the present disclosure, the stress of the entire first support portion 101a is made to achieve gradual change in elasticity modulus or stiffness, so that the first support portion 101a is stressed more uniformly, easier to fit and form, and risk of the imprint when bonding.

In the embodiment of the present disclosure, it can be determined according to the actual size of the hole h1. When the diameter of the hole h1 is in the range of 6 mm to 12 mm and the thickness of the supporting component 101 is in the range of 30 um to 100 um, a recess depth interval of the adjacent closed recesses Gr can be selected as 3 um to 15 um. Also, after etching, a thickness of the thinnest position of the first support portion 101a is not less than 15 um to 20 um, so as not to be too thin locally and have insufficient support rigidity.

In conclusion, although the present disclosure has been disclosed above with preferred embodiments. However, the above preferred embodiments are not intended to limit the present disclosure. Various changes and modifications can be made by those of ordinary skill in the art without departing from the spirit and scope of the present disclosure. Therefore, the protection scope of the present disclosure is subject to the scope defined by the claims.

What is claimed is:

1. A supporting component configured to support a display panel, comprising a hole, a first support portion, and a second support portion, wherein the first support portion is arranged around the hole, the second support portion is arranged around the first support portion, and an elasticity modulus of the second support portion is greater than an elasticity modulus of the first support portion, and wherein the first support portion comprises a plurality of support regions arranged around the hole, and in a direction from an outer edge of the first support portion to the hole, the elasticity modulus corresponding to the support regions gradually decreases.

2. The supporting component according to claim 1, further comprising at least one opening disposed in any one of the support regions, wherein in a direction from the outer edge of the first support portion to the opening, a ratio of an area of the opening to that of the support region where it is located gradually increases such that in the direction from the outer edge of the first support portion to the hole, the elasticity modulus corresponding to the support regions gradually decreases.

3. The supporting component according to claim 2, wherein in any one of the support regions, a number of the openings is at least two, and at least two of the openings are arranged at intervals around the hole.

4. The supporting component according to claim 2, wherein the hole is a circular hole, and an extension direction of the opening is the same as an extension direction of a hole wall of the hole.

5. The supporting component according to claim 4, wherein the opening comprises a first end and a second end opposite to the first end, the first end and the second end are connected to form a line segment, a direction of the line segment is the same as the extension direction of the hole wall of the hole, and in the direction from the outer edge of the first support portion to the hole, the line segment of the opening gradually decreases;
    in any one of the support regions, any two adjacent openings are separated by a first distance, and the first distance between any two adjacent openings is the same; and
    central angles of line segments of any two of the openings in a circle that is concentric with the hole are the same.

6. The supporting component according to claim 5, wherein in the direction from the outer edge of the first support portion to the hole, the first distance gradually decreases.

7. The supporting component according to claim 2, wherein the openings in any two adjacent support regions are arranged staggered in the direction from the outer edge of the first support portion to the hole.

8. The supporting component according to claim 1, further comprising at least one closed recess arranged around the hole in any one of the support regions, wherein in the direction from the outer edge of the first support portion to the hole, a distance between two adjacent closed recesses gradually decreases.

9. The supporting component according to claim 1, further comprising at least one closed recess arranged around the hole in any one of the support regions, wherein in the direction from the outer edge of the first support portion to the hole, a depth of the closed recess gradually increases.

10. The supporting component according to claim 9, wherein a distance between any two adjacent closed recesses is the same, and the distance between two adjacent closed recesses ranges from 0.15 mm to 0.55 mm.

11. A display device, comprising a display panel and a supporting component, wherein the display panel is disposed on the supporting component, and the supporting component is configured to support the display panel, and the supporting component comprises a hole, a first support portion, and a second support portion, and wherein the first support portion is arranged around the hole, the second support portion is arranged around the first support portion, and an elasticity modulus of the second support portion is greater than an elasticity modulus of the first support portion, and wherein the first support portion comprises a plurality of support regions arranged around the hole, and in a direction from an outer edge of the first support portion to the hole, the elasticity modulus corresponding to the support regions gradually decreases.

12. The display device according to claim 11, further comprising at least one opening disposed in any one of the support regions, wherein in a direction from the outer edge of the first support portion to the opening, a ratio of an area of the opening to that of the support region where it is located gradually increases such that in the direction from the outer edge of the first support portion to the hole, the elasticity modulus corresponding to the support regions gradually decreases.

13. The display device according to claim 12, wherein in any one of the support regions, a number of the openings is at least two, and at least two of the openings are arranged at intervals around the hole.

14. The display device according to claim 12, wherein the hole is a circular hole, and an extension direction of the opening is the same as an extension direction of a hole wall of the hole.

15. The display device according to claim 14, wherein the opening comprises a first end and a second end opposite to the first end, the first end and the second end are connected to form a line segment, a direction of the line segment is the same as the extension direction of the hole wall of the hole, and in the direction from the outer edge of the first support portion to the hole, the line segment of the opening gradually decreases;
    in any one of the support regions, any two adjacent openings are separated by a first distance, and the first distance between any two adjacent openings is the same; and
    central angles of line segments of any two of the openings in a circle that is concentric with the hole are the same.

16. The display device according to claim 11, further comprising at least one closed recess arranged around the hole in any one of the support regions, wherein in the direction from the outer edge of the first support portion to the hole, a depth of the closed recess gradually increases.

17. The display device according to claim 11, further comprising:
    a heat dissipation layer disposed on the supporting component, wherein the heat dissipation layer comprises a through hole, the through hole is disposed on the hole, and a width of the through hole is smaller than a width of the hole; and
    a buffer layer disposed on a side of the heat dissipation layer away from the supporting component, wherein the through hole extends through the heat dissipation layer and the buffer layer.

18. The display device according to claim 17, wherein a difference value between the hole and the through hole ranges from 1 mm to 4 mm.

* * * * *